US011636323B2

(12) United States Patent
Ramesh et al.

(10) Patent No.: US 11,636,323 B2
(45) Date of Patent: Apr. 25, 2023

(54) NEUROMORPHIC OPERATIONS USING POSITS

(71) Applicant: Micron Technology, Inc., Boise, ID (US)

(72) Inventors: Vijay S. Ramesh, Boise, ID (US); Richard C. Murphy, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 362 days.

(21) Appl. No.: 16/915,039

(22) Filed: Jun. 29, 2020

(65) Prior Publication Data

US 2021/0406659 A1 Dec. 30, 2021

(51) Int. Cl.
| G06N 3/063 | (2006.01) |
| G06F 7/48 | (2006.01) |
| H03M 1/66 | (2006.01) |
| H03M 1/12 | (2006.01) |
| G11C 11/4063 | (2006.01) |

(52) U.S. Cl.
CPC ............ *G06N 3/0635* (2013.01); *G06F 7/48* (2013.01); *G11C 11/4063* (2013.01); *H03M 1/12* (2013.01); *H03M 1/66* (2013.01)

(58) Field of Classification Search
CPC .... G06N 3/0635; G06N 3/0481; G06N 3/049; G06N 3/088; G06F 7/48; H03M 1/66; H03M 1/12; G11C 11/4063; G11C 7/1006; G11C 7/16; G11C 11/54
USPC .......................................................... 706/38
See application file for complete search history.

(56) References Cited

U.S. PATENT DOCUMENTS

| 5,572,207 | A | 11/1996 | Harding et al. |
| 11,157,803 | B2 | 10/2021 | Lee |
| 2003/0085402 | A1* | 5/2003 | Tay .................... H04N 5/37452 348/E9.037 |
| 2013/0144821 | A1 | 6/2013 | Heliot et al. |
| 2017/0103302 | A1 | 4/2017 | Henry et al. |
| 2019/0164600 | A1 | 5/2019 | Castro |

(Continued)

FOREIGN PATENT DOCUMENTS

| KR | 20180111156 A | 10/2018 |
| KR | 101965850 B1 | 4/2019 |

OTHER PUBLICATIONS

Ambrogio, et al., "Unsupervised Learning by Spike Timing Dependent Plasticity in Phase Change Memory (PCM) Synapses", vol. 10, Article 56, Mar. 8, 2016, 12 pages.

(Continued)

*Primary Examiner* — Tan V Mai
(74) *Attorney, Agent, or Firm* — Brooks, Cameron & Huebsch, PLLC

(57) ABSTRACT

Systems, apparatuses, and methods related to a neuron built with posits are described. An example system may include a memory device and the memory device may include a plurality of memory cells. The plurality of memory cells can store data including a bit string in an analog format. A neuromorphic operation can be performed on the data in the analog format. The example system may include an analog to digital converter coupled to the memory device. The analog to digital converter may convert the bit string in the analog format stored in at least one of the plurality of memory cells to a format that supports arithmetic operations to a particular level of precision.

20 Claims, 7 Drawing Sheets

(56) References Cited

U.S. PATENT DOCUMENTS

2019/0198105 A1  6/2019  Pirovano
2019/0279079 A1  9/2019  Sim et al.

OTHER PUBLICATIONS

Ambrogio, et al., "Neuromorphic Learning and Recognition With One-Transistor-One-Resistor Synapses and Bistable Metal Oxide RRAM", IEEE Transactions on Electron Devices, vol. 63, No. 4, Apr. 2016, 8 pages.
U.S. Appl. No. 16/001,790, entitled "Weight Storage Using Memory Device", filed Jun. 6, 2018, 58 pages.
Gustafson, et al., "Beating Floating Point at its Own Game: Posit Arithmetic", Research Paper, 16 pages.
Cococcioni, et al., Exploiting Posit Arithmetic for Deep Neural Networks in Autonomous Driving Applications:, Conference Paper, May 2018, 7 pages.
International Search Report and Written Opinion from related PCT Application PCT/US2021/035125, dated Sep. 14, 2021, 13 pages.

\* cited by examiner

NEUROMORPHIC OPERATIONS USING POSITS

TECHNICAL FIELD

The present disclosure relates generally to semiconductor memory and methods, and more particularly, to apparatuses, systems, and methods for neuromorphic operations using posits.

BACKGROUND

Memory devices are typically provided as internal, semiconductor, integrated circuits in computers or other electronic systems. There are many different types of memory including volatile and non-volatile memory. Volatile memory can require power to maintain its data (e.g., host data, error data, etc.) and includes random access memory (RAM), dynamic random access memory (DRAM), static random access memory (SRAM), synchronous dynamic random access memory (SDRAM), and thyristor random access memory (TRAM), among others. Non-volatile memory can provide persistent data by retaining stored data when not powered and can include NAND flash memory, NOR flash memory, and resistance variable memory such as phase change random access memory (PCRAM), resistive random access memory (RRAM), and magnetoresistive random access memory (MRAM), such as spin torque transfer random access memory (STT RAM), among others.

Memory devices may be coupled to a host (e.g., a host computing device) to store data, commands, and/or instructions for use by the host while the computer or electronic system is operating. For example, data, commands, and/or instructions can be transferred between the host and the memory device(s) during operation of a computing or other electronic system.

DETAILED DESCRIPTION

Figure 1:
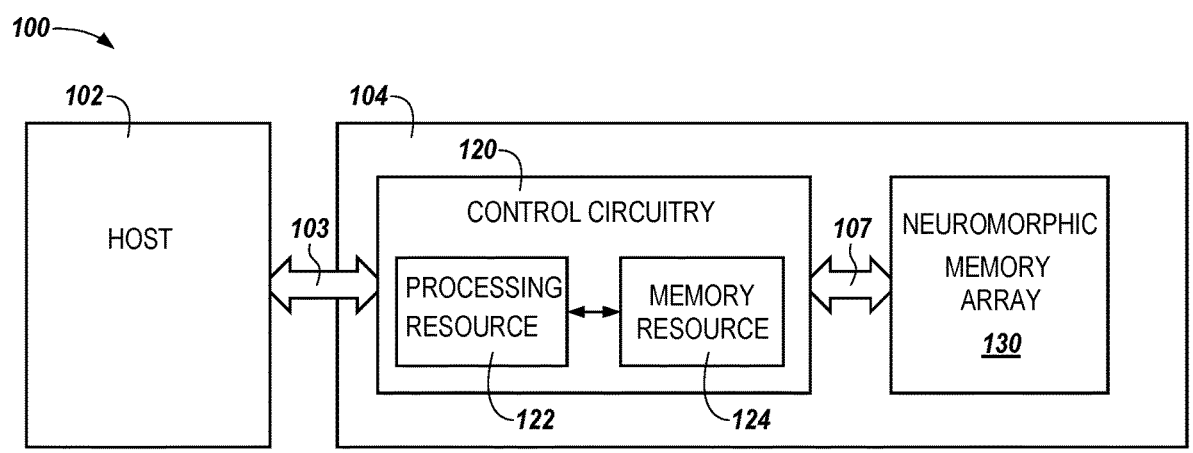
FIG. 1 is a functional block diagram in the form of a computing system including an apparatus including a host and a memory device in accordance with a number of embodiments of the present disclosure.

Systems, apparatuses, and methods related to neuromorphic operations using posits are described. An example system may include a memory device and the memory device may include a plurality of memory cells. The plurality of memory cells can store data including a bit string in an analog format. A neuromorphic operation can be performed on the data in the analog format. The example system may include an analog to digital converter coupled to the memory device. The analog to digital converter may convert the bit string in the analog format stored in at least one of the plurality of memory cells to a format that supports arithmetic operations to a particular level of precision.

The memory device may include control circuitry. The control circuitry may include a memory resource and a processing resource. The control circuitry may be coupled to a neuromorphic memory array. The memory array can store data including a bit string in an analog format. The control circuitry can control performance of neuromorphic operations on the bit string in the analog format. In this way, the neuromorphic memory array can act as a neural network. Analog weights can be input into operation of the neural network in order to train the neural network. In response to the data stored in the neural network having neuromorphic operations performed on the data, the results of the neuromorphic operations can be converted to data in a non-analog format (e.g., a format that supports arithmetic operations such as a posit format, as will be described further below). The non-analog format can be a universal number (unum) format, such as a Type III unum or posit format.

A neural network can include a set of instructions that can be executed to recognize patterns in data. Some neural networks can be used to recognize underlying relationships in a set of data in a manner that mimics the way that a human brain operates. A neural network can adapt to varying or changing inputs such that the neural network can generate a best possible result in the absence of redesigning the output criteria.

A neural network can consist of multiple neurons, which can be represented by one or more equations. In the context of neural networks, a neuron can receive a quantity of numbers or vectors as inputs and, based on properties of the neural network, produce an output. For example, a neuron can receive $X_k$ inputs, with k corresponding to an index of input. For each input, the neuron can assign a weight vector, $W_k$, to the input. The weight vectors can, in some embodiments, make the neurons in a neural network distinct from one or more different neurons in the network. In some neural networks, respective input vectors can be multiplied by respective weight vectors to yield a value, as shown by Equation 1, which shows and example of a linear combination of the input vectors and the weight vectors.

$$f(x_1, x_2) = w_1 x_1 + w_2 x_2 \qquad \text{Equation 1}$$

In some neural networks, a non-linear function (e.g., an activation function) can be applied to the value $f(x_1, x_2)$ that results from Equation 1. An example of a non-linear function that can be applied to the value that results from Equation 1 is a rectified linear unit function (ReLU). Application of the ReLU function, which is shown by Equation 2, yields the value input to the function if the value is greater than zero, or zero if the value input to the function is less than zero. The ReLU function is used here merely used as an illustrative example of an activation function and is not intended to be limiting. Other non-limiting examples of activation functions that can be applied in the context of neural networks can include sigmoid functions, binary step functions, linear activation functions, hyperbolic functions, leaky ReLU functions, parametric ReLU functions, softmax functions, and/or swish functions, among others.

$$\text{ReLU}(x)=\max(x,0) \quad \text{Equation 2}$$

During a process of training a neural network, the input vectors and/or the weight vectors can be altered to "tune" the network. In one example, a neural network can be initialized with random weights (e.g., such as analog weights). Over time, the weights can be adjusted to improve the accuracy of the neural network. This can, over time yield a neural network with high accuracy.

Neural networks have a wide range of applications. For example, neural networks can be used for system identification and control (vehicle control, trajectory prediction, process control, natural resource management), quantum chemistry, general game playing, pattern recognition (radar systems, face identification, signal classification, 3D reconstruction, object recognition and more), sequence recognition (gesture, speech, handwritten and printed text recognition), medical diagnosis, finance (e.g. automated trading systems), data mining, visualization, machine translation, social network filtering and/or e-mail spam filtering, among others.

Due to the computing resources that some neural networks demand, in some approaches, neural networks are deployed in a computing system, such as a host computing system (e.g., a desktop computer, a supercomputer, etc.) or a cloud computing environment. In such approaches, data to be subjected to the neural network as part of an operation to train the neural network can be stored in a memory resource, such as a NAND storage device, and a processing resource, such as a central processing unit, can access the data and execute instructions to process the data using the neural network. Some approaches may also utilize specialized hardware such a field-programmable gate array or an application-specific integrated circuit as part of neural network training. In other approaches, storage and training of one or more neural networks can occur within a non-volatile memory device, such as a dynamic random-access memory (DRAM) device.

Data that may be used for performing neural network (or neuromorphic) operations can be stored in particular formats. For example, data can be stored as posits, as will be described below, in order to increase accuracy of the data. However, performing neural network or neuromorphic operations on data stored as posits can be difficult or cumbersome. Data stored in an analog format can easier to perform neural network or neuromorphic operations. By allowing for conversion between a first format (e.g., a non-analog format or a posit format) and a second format (e.g., an analog format), data can be processed in order to increase the data's accuracy and converted to another format in order to be processed by a neural network.

A non-analog format can include a format referred to as a "universal number" (unum) format. There are several forms of unum formats—Type I unums, Type II unums, and Type III unums, which can be referred to as "posits" and/or "valids." Type I unums are a superset of the IEEE 754 standard floating-point format that use a "ubit" at the end of the fraction to indicate whether a real number is an exact float, or if it lies in the interval between adjacent floats. The sign, exponent, and fraction bits in a Type I unum take their definition from the IEEE 754 floating-point format, however, the length of the exponent and fraction fields of Type I unums can vary dramatically, from a single bit to a maximum user-definable length. By taking the sign, exponent, and fraction bits from the IEEE 754 standard floating-point format, Type I unums can behave similar to floating-point numbers, however, the variable bit length exhibited in the exponent and fraction bits of the Type I unum can require additional management in comparison to floats.

Referring to the floating-point standard, bit strings (e.g., strings of bits that can represent a number), such as binary number strings, are represented in terms of three sets of integers or sets of bits—a set of bits referred to as a "base," a set of bits referred to as an "exponent," and a set of bits referred to as a "mantissa" (or significand). The sets of integers or bits that define the format in which a binary number string is stored may be referred to herein as an "numeric format," or "format," for simplicity. For example, the three sets of integers of bits described above (e.g., the base, exponent, and mantissa) that define a floating-point bit string may be referred to as a format (e.g., a first format). As described in more detail below, a posit bit string may include four sets of integers or sets of bits (e.g., a sign, a regime, an exponent, and a mantissa), which may also be referred to as a "numeric format," or "format," (e.g., a second format). In addition, under the floating-point standard, two infinities (e.g., $+\infty$ and $-\infty$) and/or two kinds of "NaN" (not-a-number): a quiet NaN and a signaling NaN, may be included in a bit string.

The floating-point standard has been used in computing systems for a number of years and defines arithmetic formats, interchange formats, rounding rules, operations, and exception handling for computation carried out by many computing systems. Arithmetic formats can include binary and/or decimal floating-point data, which can include finite numbers, infinities, and/or special NaN values. Interchange formats can include encodings (e.g., bit strings) that may be used to exchange floating-point data. Rounding rules can include a set of properties that may be satisfied when rounding numbers during arithmetic operations and/or conversion operations. Floating-point operations can include arithmetic operations and/or other computational operations such as trigonometric functions. Exception handling can include indications of exceptional conditions, such as division by zero, overflows, etc.

Referring back to the universal number format, Type II unums are generally incompatible with floats, which permits a clean, mathematical design based on projected real numbers. A Type II unum can include n bits and can be described in terms of a "u-lattice" in which quadrants of a circular projection are populated with an ordered set of $2^{n-3}-1$ real numbers. The values of the Type II unum can be reflected about an axis bisecting the circular projection such that positive values lie in an upper right quadrant of the circular projection, while their negative counterparts lie in an upper left quadrant of the circular projection. The lower half of the circular projection representing a Type II unum can include reciprocals of the values that lie in the upper half of the circular projection. Type II unums generally rely on a look-up table for most operations. For example, the size of the look-up table can limit the efficacy of Type II unums in some circumstances. However, Type II unums can provide improved computational functionality in comparison with floats under some conditions.

The Type III unum format is referred to herein as a "posit format" or, for simplicity, a "posit." In contrast to floating-point bit strings, posits can, under certain conditions, allow for a broader dynamic range and a higher accuracy (e.g., precision) than floating-point numbers with the same bit width. This can allow for operations performed by a computing system to be performed at a higher rate (e.g., faster) when using posits than with floating-point numbers, which, in turn, can improve the performance of the computing system by, for example, reducing a number of clock cycles used in performing operations, thereby reducing processing time and/or power consumed in performing such operations. In addition, the use of posits in computing systems can allow for higher accuracy and/or precision than floating-point numbers, which can further improve the functioning of a computing system in comparison to some approaches (e.g., approaches which rely upon floating-point format bit strings). However, performing neural network or neuromorphic operations on data stored in the Type III unum format can be more difficult than performing such operations on data stored in an analog format.

Embodiments herein are directed to hardware circuitry (e.g., control circuitry, a digital to analog converter, an analog to digital converter, etc.) configured to perform various operations on bit strings to improve the overall functioning of a computing device. For example, embodiments herein are directed to hardware circuitry that is configured to perform conversion operations to convert a format of a bit string from a first format (e.g., a unum format, a posit format, etc.) to a second format (e.g., an analog format). Once the bit string(s) have been converted to the second format, the circuitry can be operated to perform neuromorphic operations on the converted bit strings or cause the converted bit strings to be transferred to other circuitry to perform such operations.

In some embodiments, the hardware circuitry can be further operated to convert the results of the operations back to the first format (e.g., to an unum format, a posit format, etc.), which can, in turn, be transferred to different circuitry (e.g., a host, a memory device, etc.) of the computing system. By performing the operations in such a manner, the hardware circuitry can facilitate improved performance of the neuromorphic operations for such neural network purposes while still maintaining improved accuracy and/or precision in the performance of operations performed external to the memory device and/or the neuromorphic memory array on the data in the unum or posit format, improved speed in performing the unum or posit operations, and/or a reduced required storage space for bit strings prior to, during, or subsequent to, performance of arithmetic and/or logical operations.

As used herein, the term "resident on" refers to something that is physically located on a particular component. The term "resident on" may be used interchangeably with other terms such as "deployed on" or "located on," herein.

By performing operations to convert bit strings from one format to another format, and vice versa, and/or perform arithmetic operations using hardware circuitry, such conversions can allow for usage of the data in the posit format in an improved way while also being able to perform neuromorphic operations on the data in an analog format in an improved way as well in comparison to approaches in which such operations are performed on the data in a single format. For example, performing all operations on the data in the unum/posit format can decrease efficiency of neuromorphic operations and performing all operations on the data in an analog format can reduce accuracy.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and structural changes may be made without departing from the scope of the present disclosure.

As used herein, designators such as "N," "M," etc., particularly with respect to reference numerals in the drawings, indicate that a number of the particular feature so designated can be included. It is also to be understood that the terminology used herein is for the purpose of describing particular embodiments only, and is not intended to be limiting. As used herein, the singular forms "a," "an," and "the" can include both singular and plural referents, unless the context clearly dictates otherwise. In addition, "a number of," "at least one," and "one or more" (e.g., a number of memory banks) can refer to one or more memory banks, whereas a "plurality of" is intended to refer to more than one of such things.

Furthermore, the words "can" and "may" are used throughout this application in a permissive sense (i.e., having the potential to, being able to), not in a mandatory sense (i.e., must). The term "include," and derivations thereof, means "including, but not limited to." The terms "coupled" and "coupling" mean to be directly or indirectly connected physically or for access to and movement (transmission) of commands and/or data, as appropriate to the context. The terms "bit strings," "data," and "data values" are used interchangeably herein and can have the same meaning, as appropriate to the context.

The figures herein follow a numbering convention in which the first digit or digits correspond to the figure number and the remaining digits identify an element or component in the figure. Similar elements or components between different figures may be identified by the use of similar digits. For example, 120 may reference element "20" in FIG. 1, and a similar element may be referenced as 220 in FIG. 2A. A group or plurality of similar elements or components may generally be referred to herein with a single element number. For example, a plurality of reference elements 431-1, 431-2, 431-3 may be referred to generally as 431. As will be appreciated, elements shown in the various embodiments herein can be added, exchanged, and/or eliminated so as to provide a number of additional embodiments of the present disclosure. In addition, the proportion and/or the relative scale of the elements provided in the figures are intended to illustrate certain embodiments of the present disclosure and should not be taken in a limiting sense.

FIG. 1 is a functional block diagram in the form of a computing system 100 including an apparatus including a host 102 and a memory device 104 in accordance with a number of embodiments of the present disclosure. As used herein, an "apparatus" can refer to, but is not limited to, any of a variety of structures or combinations of structures, such as a circuit or circuitry, a die or dice, a module or modules, a device or devices, or a system or systems, for example. In addition, each of the components (e.g., the host 102, the control circuitry 120, the processing resource (or logic circuitry) 122, the memory resource 124, and/or the neuromorphic memory array 130) can be separately referred to herein as an "apparatus."

The memory device 104 can include one or more memory modules (e.g., single in-line memory modules, dual in-line memory modules, etc.). The memory device 104 can include volatile memory and/or non-volatile memory. In a number of embodiments, the memory device 104 can include a multi-chip device. A multi-chip device can include a number of different memory types and/or memory modules. For example, the memory device 104 can include non-volatile or volatile memory on any type of a module.

The memory device 104 can provide main memory for the computing system 100 or can be used as additional memory or storage throughout the computing system 100. The memory device 104 can include one or more neuromorphic memory arrays 130 (e.g., arrays of memory cells), which can include volatile and/or non-volatile memory cells. The memory array 130 can be a flash array with a NAND architecture, for example. Embodiments are not limited to a particular type of memory device, however, and the memory device 104 can include RAM, ROM, DRAM, SDRAM, PCRAM, RRAM, and/or flash memory, among others.

In embodiments in which the memory device 104 includes non-volatile memory, the memory device 104 can include flash memory devices such as NAND or NOR flash memory devices. Embodiments are not so limited, however, and the memory device 104 can include other non-volatile memory devices such as non-volatile random-access memory devices (e.g., NVRAM, ReRAM, FeRAM, MRAM, PCM), "emerging" memory devices such as 3-D Crosspoint (3D XP) memory devices, etc., or combinations thereof. A 3D XP array of non-volatile memory can perform bit storage based on a change of bulk resistance, in conjunction with a stackable cross-gridded data access array. Additionally, in contrast to many flash-based memories, 3D XP non-volatile memory can perform a write in-place operation, where a non-volatile memory cell can be programmed without the non-volatile memory cell being previously erased.

As illustrated in FIG. 1, a host 102 can be coupled to the memory device 104. In a number of embodiments, the host 102 can be coupled to the memory device 104 via one or more channels 103 (e.g., buses, interfaces, communication paths, etc.). In addition, the control circuitry 120 of the memory device 104 can be coupled to the memory array 130 via a channel 107. The channel(s) 103 can be used to transfer data between the memory system 104 and a host 102 and can be in the form of a standardized interface. For example, when the memory system 104 is used for data storage in a computing system 100, the channel(s) 103 can be a serial advanced technology attachment (SATA), peripheral component interconnect express (PCIe), or a universal serial bus (USB), a double data rate (DDR) interface, among other connectors and interfaces. In general, however, channel(s) 103 can provide an interface for passing control, address, data, and other signals between the memory system 104 and a host 102 having compatible receptors for the channel(s) 103.

The host 102 can be a host system such as a personal laptop computer, a desktop computer, a digital camera, a mobile telephone, an internet-of-things (IoT) enabled device, or a memory card reader, graphics processing unit (e.g., a video card), among various other types of hosts. The host 102 can include a system motherboard and/or backplane and can include a number of memory access devices, e.g., a number of processing devices (e.g., one or more processors, microprocessors, or some other type of controlling circuitry). One of ordinary skill in the art will appreciate that "a processor" can intend one or more processors, such as a parallel processing system, a number of coprocessors, etc.

The system 100 can include separate integrated circuits or both the host 102, the memory device 104, and the memory array 130 can be on the same integrated circuit. The system 100 can be, for instance, a server system and/or a high-performance computing (HPC) system and/or a portion thereof. Although the example shown in FIG. 1 illustrates a system having a Von Neumann architecture, embodiments of the present disclosure can be implemented in non-Von Neumann architectures, which may not include one or more components (e.g., CPU, ALU, etc.) often associated with a Von Neumann architecture.

In some embodiments, the host 102 can be responsible for executing an operating system for a computing system 100 that includes the memory device 104. Accordingly, in some embodiments, the host 102 can be responsible for controlling operation of the memory device 104. For example, the host 102 can execute instructions (e.g., in the form of an operating system) that manage the hardware of the computing system 100 such as scheduling tasks, executing applications, controlling peripherals, etc.

Figure 2A:
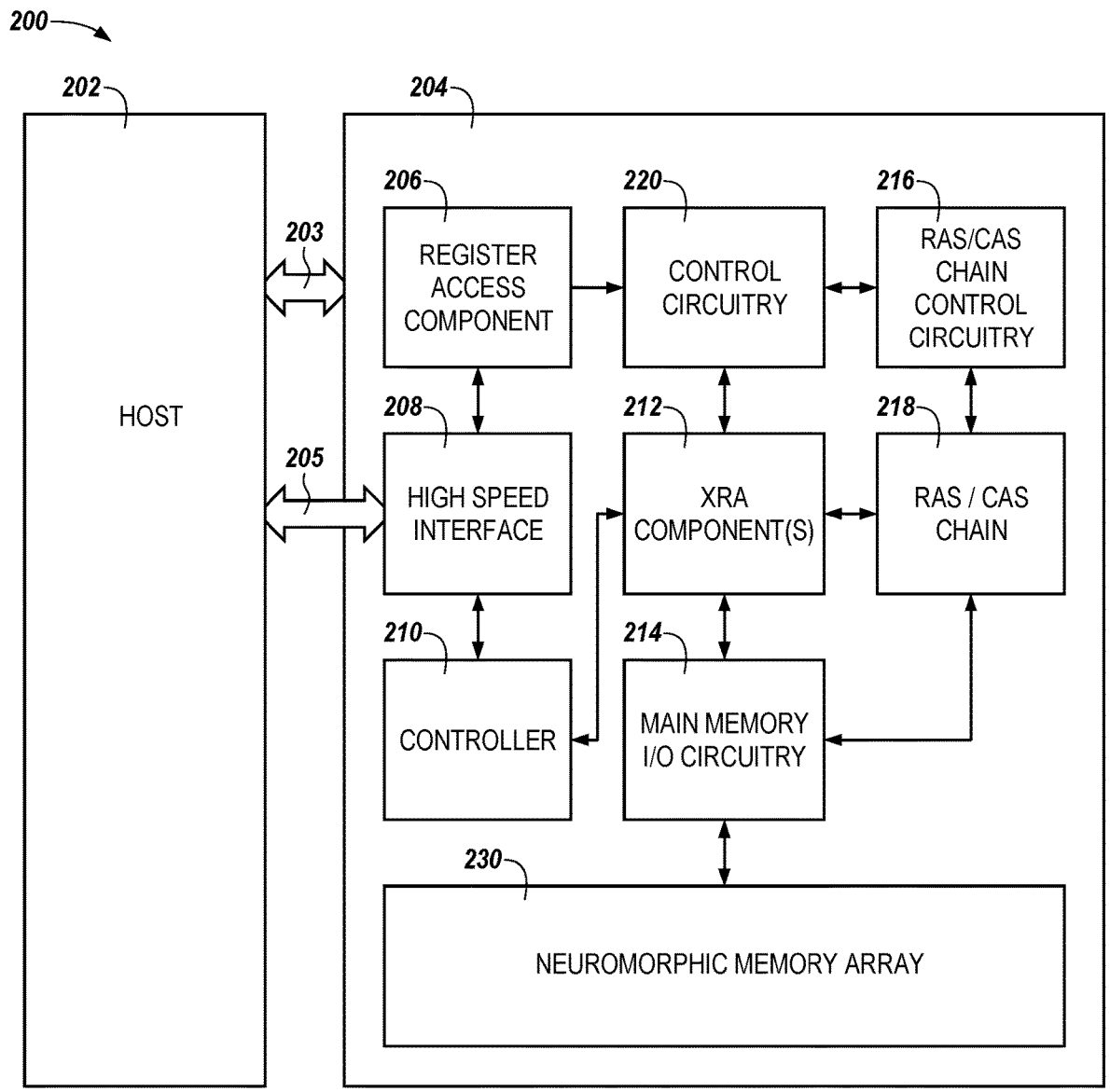
FIG. 2A is another functional block diagram in the form of a computing system including an apparatus including a host and a memory device in accordance with a number of embodiments of the present disclosure.
Figure 2B:
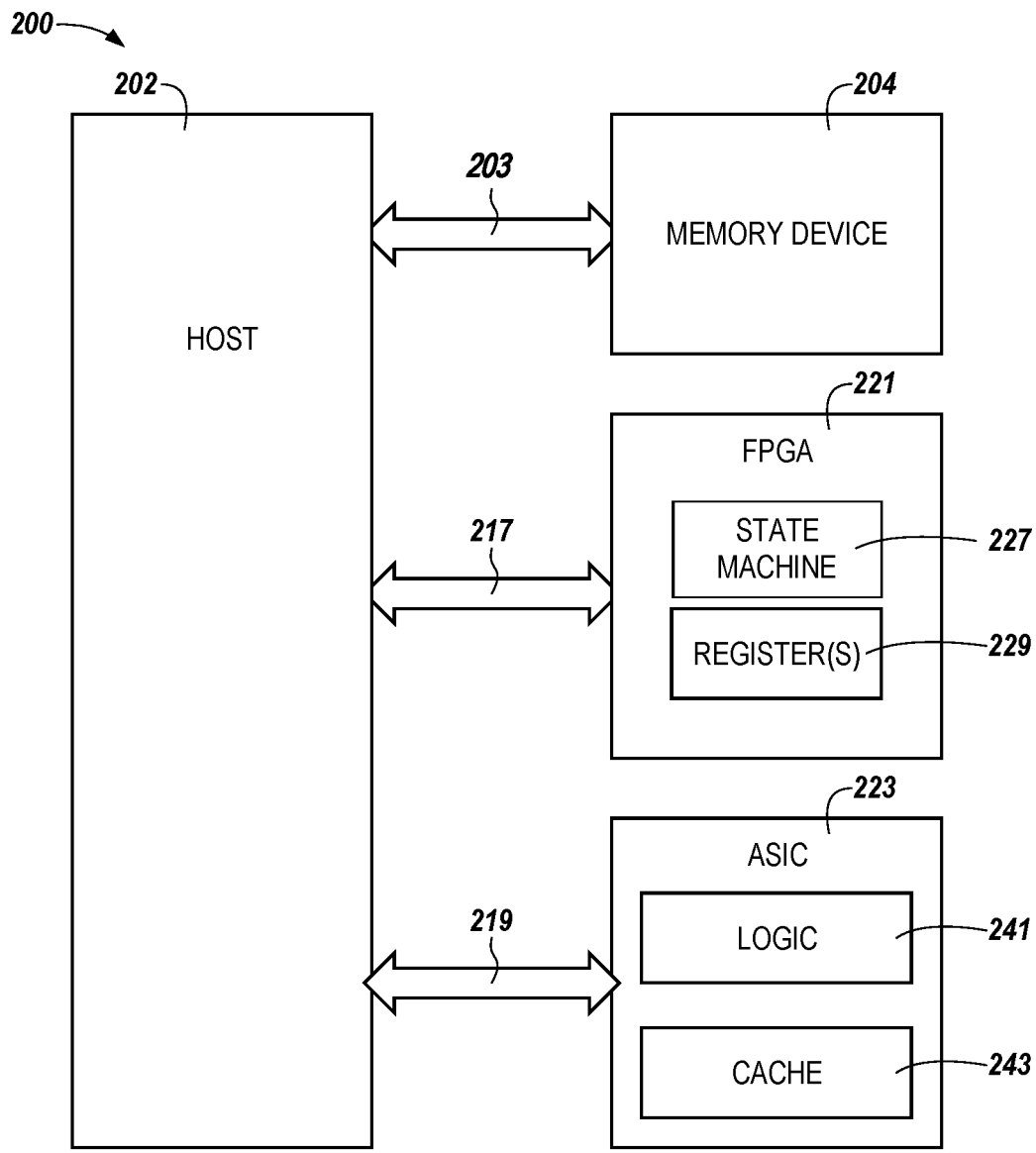
FIG. 2B is a functional block diagram in the form of a computing system including a host, a memory device, an application-specific integrated circuit, and a field programmable gate array in accordance with a number of embodiments of the present disclosure.

The memory device 104, which is shown in more detail in FIGS. 2A and 2B, herein, can include control circuitry 120, which can include a processing resource 122 and a memory resource 124. The processing resource 122 can be provided in the form of an integrated circuit, such as an application-specific integrated circuit (ASIC), field programmable gate array (FPGA), system-on-a-chip, or other combination of hardware and/or circuitry that is configured to perform arithmetic and/or logical operations on bit string received from the host 102 and/or other external devices, as described in more detail, herein. In some embodiments, the processing resource 122 can include an arithmetic logic unit (ALU). The ALU can include circuitry (e.g., hardware, logic, one or more processing devices, etc.) to perform operations (e.g., arithmetic operations, logical operations, bitwise operations, etc.) such as the operations described above, on integer binary bit strings, such as bit strings in the posit format. Embodiments are not limited to an ALU, however, and in some embodiments, the processing resource 122 can include a state machine and/or an instruction set architecture (or combinations thereof) in addition to, or in lieu of the ALU, as described in more detail in connection with FIG. 5, herein.

For example, the processing resource 122 can be configured to receive one or more bit strings (e.g., a plurality of bits) in a posit format and/or cause performance of operations such as arithmetic and/or logical operations using the bit strings in the posit format. In contrast to bit strings in the floating-point format, which include three integers or sets of bits—a set of bits referred to as a "base," a set of bits referred to as an "exponent," and a set of bits referred to as a "mantissa" (or significand), the bit string(s) in the posit format include four sets of bits—at least one bit referred to as a "sign," a set of bits referred to as a "regime," a set of bits referred to as an "exponent," and a set of bits referred to as a "mantissa" (or significand). As used herein, a set of bits is intended to refer to a subset of bits included in a bit string. Examples of the sign, regime, exponent, and mantissa sets of bits are described in more detail in connection with FIGS. 3 and 4A-4B, herein.

In some embodiments, the processing resource 122 can be configured to perform (or cause performance of) arithmetic operations such as addition, subtraction, multiplication, division, fused multiply addition, multiply-accumulate, dot product units, greater than or less than, absolute value (e.g., FABS( )), fast Fourier transforms, inverse fast Fourier transforms, sigmoid function, convolution, square root, exponent, and/or logarithm operations, and/or logical operations such as AND, OR, XOR, NOT, etc., as well as trigonometric operations such as sine, cosine, tangent, etc. using the posit bit strings. As will be appreciated, the foregoing list of operations is not intended to be exhaustive, nor is the foregoing list of operations intended to be limiting, and the processing resource 122 may be configured to perform (or cause performance of) other arithmetic and/or logical operations.

After the control circuitry 120 has performed an arithmetic and/or logical operation on the bit string(s), the control circuitry 120 can cause a resultant (e.g., a resultant bit string representing a result of the arithmetic operation and/or the logical operation) bit string to be transferred to the host 102, and/or the neuromorphic memory array 130. In some embodiments, the resultant bit string can be sent to the neuromorphic memory array 130 and the resultant bit string can be converted to an analog format. The resultant bit string in the analog format can be used as an input to a number of neuromorphic operations. In some embodiments, the control circuitry 120 can transfer the resultant bit string(s) to the host 102, and/or the neuromorphic memory array 130, for example, in the posit format (and in the case of the neuromorphic memory array 130, converted to an analog format).

The control circuitry 120 can further include a memory resource 124, which can be communicatively coupled to the processing resource 122. The memory resource 124 can include volatile memory resource, non-volatile memory resources, or a combination of volatile and non-volatile memory resources. In some embodiments, the memory resource 124 can be a random-access memory (RAM) such as static random-access memory (SRAM). Embodiments are not so limited, however, and the memory resource 124 can be a cache, one or more registers, NVRAM, ReRAM, FeRAM, MRAM, PCM, "emerging" memory devices such as 3-D Crosspoint (3D XP) memory devices, etc., or combinations thereof.

The control circuitry 120 can be communicatively coupled to the neuromorphic memory array 130 via one or more channels 107. The neuromorphic memory array 130 can be a DRAM array, SRAM array, STT RAM array, PCRAM array, TRAM array, RRAM array, NAND flash array, and/or NOR flash array, for instance. The array 130 can comprise memory cells arranged in rows coupled by access lines, which may be referred to herein as word lines or select lines, and columns coupled by sense lines, which may be referred to herein as data lines or digit lines. Although a single array 130 is shown in FIG. 1, embodiments are not so limited. For instance, memory device 104 a number of memory arrays 130 (e.g., a number of banks of DRAM cells, NAND flash cells, etc.).

The embodiment of FIG. 1 can include additional circuitry that is not illustrated so as not to obscure embodiments of the present disclosure. For example, the memory device 104 can include address circuitry to latch address signals provided over I/O connections through I/O circuitry. Address signals can be received and decoded by a row decoder and a column decoder to access the memory device 104 and/or the neuromorphic memory array 130. It will be appreciated by those skilled in the art that the number of address input connections can depend on the density and architecture of the memory device 104 and/or the memory array 130.

FIG. 2A is another functional block diagram in the form of a computing system including an apparatus 200 including a host 202 and a memory device 204 in accordance with a number of embodiments of the present disclosure. The memory device 204 can include control circuitry 220, which can be analogous to the control circuitry 120 illustrated in FIG. 1. Similarly, the host 202 can be analogous to the host 102 illustrated in FIG. 1, the memory device 204 can be analogous to the memory device 104 illustrated in FIG. 1, and the neuromorphic memory array 230 can be analogous to the neuromorphic memory array 130 illustrated in FIG. 1. Each of the components (e.g., the host 202, the control circuitry 220, the processing resource 222, the memory resource 224, and/or the neuromorphic memory array 230, etc.) can be separately referred to herein as an "apparatus."

The host 202 can be communicatively coupled to the memory device 204 via one or more channels 203, 205. The channels 203, 205 can be interfaces, buses, communication paths, or other physical connections that allow for data and/or commands to be transferred between the host 202 and the memory device 204. The channels 203, 205 can be used to transfer data between the memory system 204 and a host 202 and can be in the form of a standardized interface.

When the memory system 204 is used for data storage in a computing system 200, the channels 203, 205 can be a serial advanced technology attachment (SATA), peripheral component interconnect express (PCIe), or a universal serial bus (USB), a double data rate (DDR) interface, among other connectors and interfaces. In general, however, channels 203, 205 can provide an interface for passing control, address, data, and other signals between the memory system 204 and a host 202 having compatible receptors for the channels 203, 205. In some embodiments, commands to cause initiation of an operation (e.g., an operation to perform arithmetic and/or logical operations on the bit string(s) in the posit format) to be performed by the control circuitry 220 can be transferred from the host via the channels 203, 205.

It is noted that, in some embodiments, the control circuitry 220 can perform the arithmetic and/or logical operations in response to an initiation command transferred from the host 202 via one or more of the channels 203, 205 in the absence of an intervening command from the host 202. That is, once the control circuitry 220 has received the command to initiate performance of an operation from the host 202, the operations can be performed by the control circuitry 220 in the absence of additional commands from the host 202. However, in some embodiments, the control circuitry 220 can perform the operations in response to receipt of a bit string (e.g., a bit string in the posit format) in the absence of a command (e.g., an initiation command) from the host 202 specifying that the operation is to be performed. For example, the control circuitry 220 can be configured to self-initiate performance of arithmetic and/or logical operations on the received bit string(s) in response to receiving the bit string(s). However, in some embodiments, in response to receiving a command to perform neuromorphic operations on the data, the data can be converted to an analog format while being sent to the neuromorphic memory array 230.

As used herein, a "first level of precision" and a "second level of precision" generally refer to the accuracy of a bit string and/or a resultant bit string that represent a result of an operation performed using one or more bit strings. For example, floating-point format bit strings can be described herein as having a "first level of precision," while unum bit strings (e.g., posit format bit strings) can be referred to as having a particular precision or "second level of precision," because, as described in more detail herein, unum bit strings can offer a higher level of precision under certain conditions than floating-point formatted numbers.

In some embodiments, the floating-point format or the unum format can refer to a digital format while an additional format can include an analog format. A digital format can use discrete values such as a "0" or a "1", while an analog format can use more continuous values and can represent physical measurements along that continuum.

As shown in FIG. 2A, the memory device 204 can include a register access component 206, a high speed interface (HSI) 208, a controller 210, one or more extended row address (XRA) component(s) 212, main memory input/output (I/O) circuitry 214, row address strobe (RAS)/column address strobe (CAS) chain control circuitry 216, a RAS/CAS chain component 218, control circuitry 220, and a neuromorphic memory array 230. The control circuitry 220 is, as shown in FIG. 2A, located in an area of the memory device 204 that is physically distinct from the neuromorphic memory array 230. That is, in some embodiments, the control circuitry 220 is located in a periphery location of the neuromorphic memory array 230.

The register access component 206 can facilitate transferring and fetching of data from the host 202 to the memory device 204 and from the memory device 204 to the host 202. For example, the register access component 206 can store addresses (or facilitate lookup of addresses), such as memory addresses, that correspond to data that is to be transferred to the host 202 form the memory device 204 or transferred from the host 202 to the memory device 204. In some embodiments, the register access component 206 can facilitate transferring and fetching data that is to be operated upon by the control circuitry 220 and/or the register access component 206 can facilitate transferring and fetching data that is has been operated upon by the control circuitry 220 for transfer to the host 202.

The HSI 208 can provide an interface between the host 202 and the memory device 204 for commands and/or data traversing the channel 205. The HSI 208 can be a double data rate (DDR) interface such as a DDR3, DDR4, DDR5, etc. interface. Embodiments are not limited to a DDR interface, however, and the HSI 208 can be a quad data rate (QDR) interface, peripheral component interconnect (PCI) interface (e.g., a peripheral component interconnect express (PCIe)), or other suitable interface for transferring commands and/or data between the host 202 and the memory device 204 via the channel(s) 203, 205.

The controller 210 can be responsible for executing instructions from the host 202 and accessing the control circuitry 220 and/or the neuromorphic memory array 230. The controller 210 can be a state machine, a sequencer, or some other type of controller. The controller 210 can receive commands from the host 202 (via the HSI 208, for example) and, based on the received commands, control operation of the control circuitry 220 and/or the neuromorphic memory array 230. In some embodiments, the controller 210 can receive a command from the host 202 to cause performance of an arithmetic and/or logical operation on received bit strings using the control circuitry 220. Responsive to receipt of such a command, the controller 210 can instruct the control circuitry 220 to begin performance of the arithmetic and/or logical operation(s).

In some embodiments, the controller 210 can be a global processing controller and may provide power management functions to the memory device 204. Power management functions can include control over power consumed by the memory device 204 and/or the neuromorphic memory array 230. For example, the controller 210 can control power provided to various banks of the neuromorphic memory array 230 to control which banks of the neuromorphic memory array 230 are operational at different times during operation of the memory device 204. This can include shutting certain banks of the neuromorphic memory array 230 down while providing power to other banks of the neuromorphic memory array 230 to optimize power consumption of the memory device 230. In some embodiments, the controller 210 controlling power consumption of the memory device 204 can include controlling power to various cores of the memory device 204 and/or to the control circuitry 220, the neuromorphic memory array 230, etc.

The XRA component(s) 212 are intended to provide additional functionalities (e.g., peripheral amplifiers) that sense (e.g., read, store, cache) data values of memory cells in the neuromorphic memory array 230 and that are distinct from the neuromorphic memory array 230. The XRA components 212 can include latches and/or registers. For example, additional latches can be included in the XRA component 212. The latches of the XRA component 212 can be located on a periphery of the neuromorphic memory array 230 (e.g., on a periphery of one or more banks of memory cells) of the memory device 204.

The main memory input/output (I/O) circuitry 214 can facilitate transfer of data and/or commands to and from the neuromorphic memory array 230. For example, the main memory I/O circuitry 214 can facilitate transfer of bit strings, data, and/or commands from the host 202 and/or the control circuitry 220 to and from the neuromorphic memory array 230. In some embodiments, the main memory I/O circuitry 214 can include one or more direct memory access (DMA) components that can transfer the bit strings (e.g., posit bit strings stored as blocks of data) from the control circuitry 220 to the neuromorphic memory array 230, and vice versa.

In some embodiments, the main memory I/O circuitry 214 can facilitate transfer of bit strings, data, and/or commands from the neuromorphic memory array 230 to the control circuitry 220 so that the control circuitry 220 can perform arithmetic and/or logical operations on the bit strings. Similarly, the main memory I/O circuitry 214 can facilitate transfer of bit strings that have had one or more operations performed on them by the control circuitry 220 to the neuromorphic memory array 230. In this way, the data in the unum or posit format can be operated on by the control circuitry 220 to perform arithmetic and/or logical operations while the data is stored in an array or other location other than the neuromorphic memory array 230; and the data in the analog format, while being stored in the neuromorphic memory array 230, can be used to perform neuromorphic operations. As described in more detail herein, the operations can include arithmetic operations performed on bit strings in a posit format, logical operations performed on bit strings in a posit format, bitwise operations performed on bit strings in a posit format, etc., and neuromorphic operations performed on bit strings in an analog format.

The row address strobe (RAS)/column address strobe (CAS) chain control circuitry 216 and the RAS/CAS chain component 218 can be used in conjunction with the neuromorphic memory array 230 to latch a row address and/or a column address to initiate a memory cycle. In some embodiments, the RAS/CAS chain control circuitry 216 and/or the RAS/CAS chain component 218 can resolve row and/or column addresses of the neuromorphic memory array 230 at which read and write operations associated with the neuromorphic memory array 230 are to be initiated or terminated. For example, upon completion of an operation using the control circuitry 220, the RAS/CAS chain control circuitry 216 and/or the RAS/CAS chain component 218 can latch and/or resolve a specific location in the neuromorphic memory array 230 to which the bit strings that have been operated upon by the control circuitry 220 to perform neuromorphic operations are to be stored. Similarly, the RAS/CAS chain control circuitry 216 and/or the RAS/CAS chain component 218 can latch and/or resolve a specific location in the neuromorphic memory array 230 from which bit strings are to be transferred to the control circuitry 220 prior to the control circuitry 220 performing a neuromorphic operation on the bit string(s) in an analog format.

As described above in connection with FIG. 1, the neuromorphic memory array 230 can be a DRAM array, SRAM array, STT RAM array, PCRAM array, TRAM array, RRAM array, NAND flash array, and/or NOR flash array, for instance, although embodiments are not limited to these particular examples. The neuromorphic memory array 230 can function as main memory for the computing system 200 shown in FIG. 2. In some embodiments, the neuromorphic memory array 230 can be configured to store bit strings operated on by the control circuitry 220 and/or store bit strings to be transferred to the control circuitry 220.

The control circuitry 220 can include logic circuitry (e.g., the processing resource 122 illustrated in FIG. 1) and/or memory resource(s) (e.g., the memory resource 124 illustrated in FIG. 1). As described above in connection with FIG. 1 and in more detail below in connection with FIG. 6, the control circuitry 220 can be configured to receive one or more bit strings in the posit format and cause performance of operations such as arithmetic and/or logical operations using the one or more bit strings in the posit format and can be configured to convert the one or more bits strings in the posit format to an analog format upon receipt by the neuromorphic memory array 230.

For example, bit strings (e.g., data, a plurality of bits, etc.) can be received by the control circuitry 220 from, for example, the host 202 in a first format (e.g., posit format), and/or the neuromorphic memory array 230 (e.g., in an analog format), and stored by the control circuitry 220, for example in the memory resource (e.g., the memory resource 624 illustrated in FIG. 6, herein) of the control circuitry 220. The control circuitry 220 can perform arithmetic and/or logical operations (or cause arithmetic and/or logical operations to be performed on) the bit string(s), as described in more detail in connection with FIG. 6, herein.

As described in more detail in connection with FIGS. 3 and 4A-4B, posits can provide improved accuracy (e.g., precision) and may require less storage space (e.g., may contain a smaller number of bits) than corresponding bit strings represented in the floating-point format. Accordingly, by converting the posit bit strings to analog bit strings and performing neuromorphic operations using neural networks using the control circuitry 220, performance of the computing system 200 may be improved in comparison to approaches that utilize posit bit strings for performance of neuromorphic operations, because neuromorphic operations may be performed more quickly on the analog bit strings (e.g., because the neuromorphic operations lend themselves more efficient when working with analog data.

As described above, once the control circuitry 220 has received the posit bit strings from the host 202, and/or the neuromorphic memory array 230 (once converted from analog to posit upon exit from the neuromorphic memory array 230), the control circuitry 220 can perform (or cause performance of) arithmetic and/or logical operations on the received posit bit strings. For example, the control circuitry 220 can be configured to perform (or cause performance of) arithmetic operations such as addition, subtraction, multiplication, division, fused multiply addition, multiply-accumulate, dot product units, greater than or less than, absolute value (e.g., FABS( )), fast Fourier transforms, inverse fast Fourier transforms, sigmoid function, convolution, square root, exponent, and/or logarithm operations, and/or logical operations such as AND, OR, XOR, NOT, etc., as well as trigonometric operations such as sine, cosine, tangent, etc. on the received posit bit strings. As will be appreciated, the foregoing list of operations is not intended to be exhaustive, nor is the foregoing list of operations intended to be limiting, and the control circuitry 220 may be configured to perform (or cause performance of) other arithmetic and/or logical operations on posit bit strings.

In some embodiments, the control circuitry 220 may perform the above-listed operations in conjunction with execution of one or more machine learning algorithms. For example, the control circuitry 220 may perform operations related to one or more neural networks such as is used in the neuromorphic memory array 230. Neural networks may allow for an algorithm to be trained over time to determine an output response based on input signals. For example, over time, a neural network may essentially learn to better maximize the chance of completing a particular goal. This may be advantageous in machine learning applications because the neural network may be trained over time with new data to achieve better maximization of the chance of completing the particular goal. A neural network may be trained over time to improve operation of particular tasks and/or particular goals. However, in some approaches, machine learning (e.g., neural network training) may be processing intensive (e.g., may consume large amounts of computer processing resources) and/or may be time intensive (e.g., may require lengthy calculations that consume multiple cycles to be performed) when using data in a posit format to do so. In contrast, by performing such operations using the control circuitry 220, for example, by performing such operations on bit strings in the analog format, the amount of processing resources and/or the amount of time consumed in performing the operations may be reduced in comparison to approaches in which such operations are performed using bit strings in a posit format.

FIG. 2B is a functional block diagram in the form of a computing system 200 including a host 202, a memory device 204, an application-specific integrated circuit 223, and a field programmable gate array 221 in accordance with a number of embodiments of the present disclosure. Each of the components (e.g., the host 202, the memory device 204, the FPGA 221, the ASIC 223, etc.) can be separately referred to herein as an "apparatus."

As shown in FIG. 2B, the host 202 can be coupled to the memory device 204 via channel(s) 203, which can be analogous to the channel(s) 103 illustrated in FIG. 1. The field programmable gate array (FPGA) 221 can be coupled to the host 202 via channel(s) 217 and the application-specific integrated circuit (ASIC) 223 can be coupled to the host 202 via channel(s) 219. In some embodiments, the channel(s) 217 and/or the channel(s) 219 can include a peripheral serial interconnect express (PCIe) interface, however, embodiments are not so limited, and the channel(s) 217 and/or the channel(s) 219 can include other types of interfaces, buses, communication channels, etc. to facilitate transfer of data between the host 202 and the FPGA 221 and/or the ASIC 223.

As described above, non-limiting examples of arithmetic and/or logical operations that can be performed by the FPGA 221 and/or the ASIC 223 include arithmetic operations such as addition, subtraction, multiplication, division, fused multiply addition, multiply-accumulate, dot product units, greater than or less than, absolute value (e.g., FABS( ), fast Fourier transforms, inverse fast Fourier transforms, sigmoid function, convolution, square root, exponent, and/or logarithm operations, and/or logical operations such as AND, OR, XOR, NOT, etc., as well as trigonometric operations such as sine, cosine, tangent, etc. using the posit bit strings.

The FPGA 221 can include a state machine 227 and/or register(s) 229. The state machine 227 can include one or more processing devices that are configured to perform operations on an input and produce an output. For example, the FPGA 221 can be configured to receive posit bit strings from the host 202 and perform arithmetic and/or logical operations on the posit bit strings to produce resultant posit bit strings that represents a result of the operation performed on the received posit bit strings. Further, the FPGA 221 can be configured to cause performance of neuromorphic operations in the neuromorphic memory array 230 on data that has been converted to an analog format.

The register(s) 229 of the FPGA 221 can be configured to buffer and/or store the posit bit strings received form the host 202 prior to the state machine 227 performing an operation on the received posit bit strings. In addition, the register(s) 229 of the FPGA 221 can be configured to buffer and/or store a resultant posit bit string that represents a result of the operation performed on the received posit bit strings prior to transferring the result to circuitry external to the ASIC 233, such as the host 202 or the memory device 204, etc.

The ASIC 223 can include logic 241 and/or a cache 243. The logic 241 can include circuitry configured to perform operations on an input and produce an output. In some embodiments, the ASIC 223 is configured to receive posit bit strings from the host 202 and perform arithmetic and/or logical operations on the posit bit strings to produce resultant posit bit strings that represents a result of the operation performed on the received posit bit strings. Likewise, the ASIC 223 can facilitate the conversion of the posit bit strings to analog bit strings and the subsequent neuromorphic operations to be performed on the analog bit strings.

The cache 243 of the ASIC 223 can be configured to buffer and/or store the posit bit strings received form the host 202 prior to the logic 241 performing an operation on the received posit bit strings. In addition, the cache 243 of the ASIC 223 can be configured to buffer and/or store a resultant posit bit string that represents a result of the operation performed on the received posit bit strings prior to transferring the result to circuitry external to the ASIC 233, such as the host 202 or the memory device 204, etc.

Although the FPGA 227 is shown as including a state machine 227 and register(s) 229, in some embodiments, the FPGA 221 can include logic, such as the logic 241, and/or a cache, such as the cache 243 in addition to, or in lieu of, the state machine 227 and/or the register(s) 229. Similarly, the ASIC 223 can, in some embodiments, include a state machine, such as the state machine 227, and/or register(s), such as the register(s) 229 in addition to, or in lieu of, the logic 241 and/or the cache 243.

Figure 3:
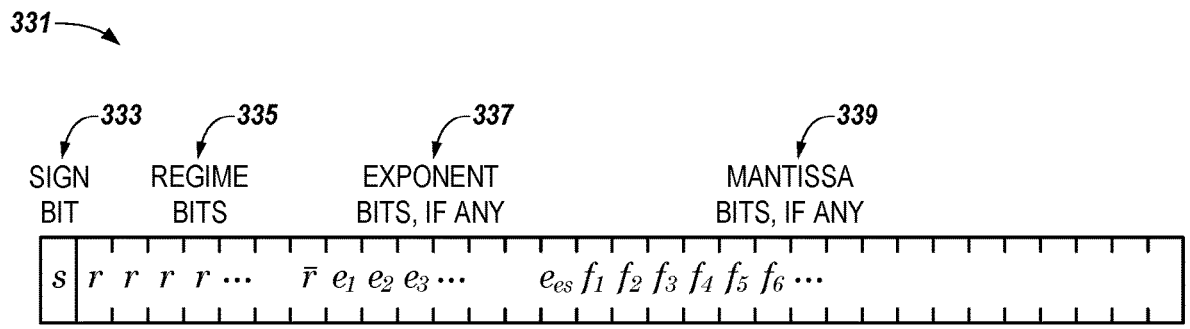
FIG. 3 is an example of an n-bit post with es exponent bits.

FIG. 3 is an example of an n-bit universal number, or "unum" with es exponent bits. In the example of FIG. 3, the n-bit unum is a posit bit string 331. As shown in FIG. 3, the n-bit posit 331 can include a set of sign bit(s) (e.g., a sign bit 333), a set of regime bits (e.g., the regime bits 335), a set of exponent bits (e.g., the exponent bits 337), and a set of mantissa bits (e.g., the mantissa bits 339). The mantissa bits 339 can be referred to in the alternative as a "fraction portion" or as "fraction bits," and can represent a portion of a bit string (e.g., a number) that follows a decimal point.

The sign bit 333 can be zero (0) for positive numbers and one (1) for negative numbers. The regime bits 335 are described in connection with Table 1, below, which shows (binary) bit strings and their related numerical meaning, k.

In Table 1, the numerical meaning, k, is determined by the run length of the bit string. The letter x in the binary portion of Table 1 indicates that the bit value is irrelevant for determination of the regime, because the (binary) bit string is terminated in response to successive bit flips or when the end of the bit string is reached. For example, in the (binary) bit string 0010, the bit string terminates in response to a zero flipping to a one and then back to a zero. Accordingly, the last zero is irrelevant with respect to the regime and all that is considered for the regime are the leading identical bits and the first opposite bit that terminates the bit string (if the bit string includes such bits).

TABLE 1

| Binary | 0000 | 0001 | 001X | 01XX | 10XX | 110X | 1110 | 1111 |
|---|---|---|---|---|---|---|---|---|
| Numerical (k) | −4 | −3 | −2 | −1 | 0 | 1 | 2 | 3 |

In FIG. 3, the regime bits 335 r correspond to identical bits in the bit string, while the regime bits 335 r̄ correspond to an opposite bit that terminates the bit string. For example, for the numerical k value −2 shown in Table 1, the regime bits r correspond to the first two leading zeros, while the regime bit(s) r̄ correspond to the one. As noted above, the final bit corresponding to the numerical k, which is represented by the X in Table 1 is irrelevant to the regime.

If m corresponds to the number of identical bits in the bit string, if the bits are zero, k=−m. If the bits are one, then k=m−1. This is illustrated in Table 1 where, for example, the (binary) bit string 10XX has a single one and k=m−1=1−1=0. Similarly, the (binary) bit string 0001 includes three zeros so k=−m=−3. The regime can indicate a scale factor of $useed^k$, where $useed=2^{2^{es}}$. Several example values for used are shown below in Table 2.

TABLE 2

| es | 0 | 1 | 2 | 3 | 4 |
|---|---|---|---|---|---|
| used | 2 | $2^2 = 4$ | $4^2 = 16$ | $16^2 = 256$ | $256^2 = 65536$ |

The exponent bits 337 correspond to an exponent e, as an unsigned number. In contrast to floating-point numbers, the exponent bits 337 described herein may not have a bias associated therewith. As a result, the exponent bits 337 described herein may represent a scaling by a factor of $2^e$. As shown in FIG. 3, there can be up to es exponent bits ($e_1$, $e_2$, $e_3$, ..., $e_{es}$), depending on how many bits remain to right of the regime bits 335 of the n-bit posit 331. In some embodiments, this can allow for tapered accuracy of the n-bit posit 331 in which numbers which are nearer in magnitude to one have a higher accuracy than numbers which are very large or very small. However, as very large or very small numbers may be utilized less frequent in certain kinds of operations, the tapered accuracy behavior of the n-bit posit 331 shown in FIG. 3 may be desirable in a wide range of situations.

The mantissa bits 339 (or fraction bits) represent any additional bits that may be part of the n-bit posit 331 that lie to the right of the exponent bits 337. Similar to floating-point bit strings, the mantissa bits 339 represent a fraction f, which can be analogous to the fraction 1.f, where f includes one or more bits to the right of the decimal point following the one. In contrast to floating-point bit strings, however, in the n-bit posit 331 shown in FIG. 3, the "hidden bit" (e.g., the one)

may always be one (e.g., unity), whereas floating-point bit strings may include a subnormal number with a "hidden bit" of zero (e.g., 0f.

Figure 4A:
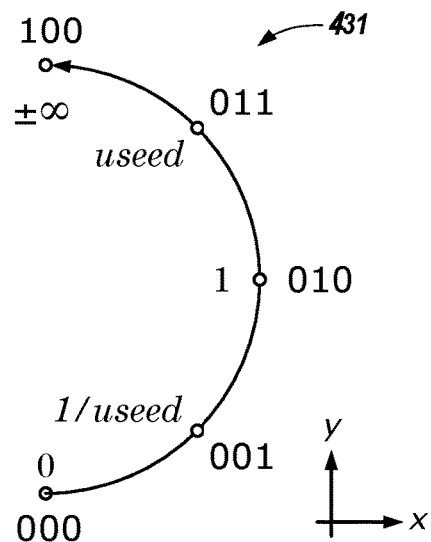
FIG. 4A is an example of positive values for a 3-bit posit.

FIG. 4A is an example of positive values for a 3-bit posit 431. In FIG. 4A, only the right half of projective real numbers, however, it will be appreciated that negative projective real numbers that correspond to their positive counterparts shown in FIG. 4A can exist on a curve representing a transformation about the y-axis of the curves shown in FIG. 4A.

In the example of FIG. 4A, es=2, so useed=$2^{2^{es}}$=16. The precision of a posit 431 can be increased by appending bits the bit string, as shown in FIG. 4B. For example, appending a bit with a value of one (1) to bit strings of the posit 431-1 increases the accuracy of the posit 431 as shown by the posit 431-2 in FIG. 4B. Similarly, appending a bit with a value of one to bit strings of the posit 431-2 in FIG. 4B increases the accuracy of the posit 431-2 as shown by the posit 431-3 shown in FIG. 4B. An example of interpolation rules that may be used to append bits to the bits strings of the posits 431-1 shown in FIG. 4A to obtain the posits 431-2, 431-3 illustrated in FIG. 4B follow.

Figure 4B:
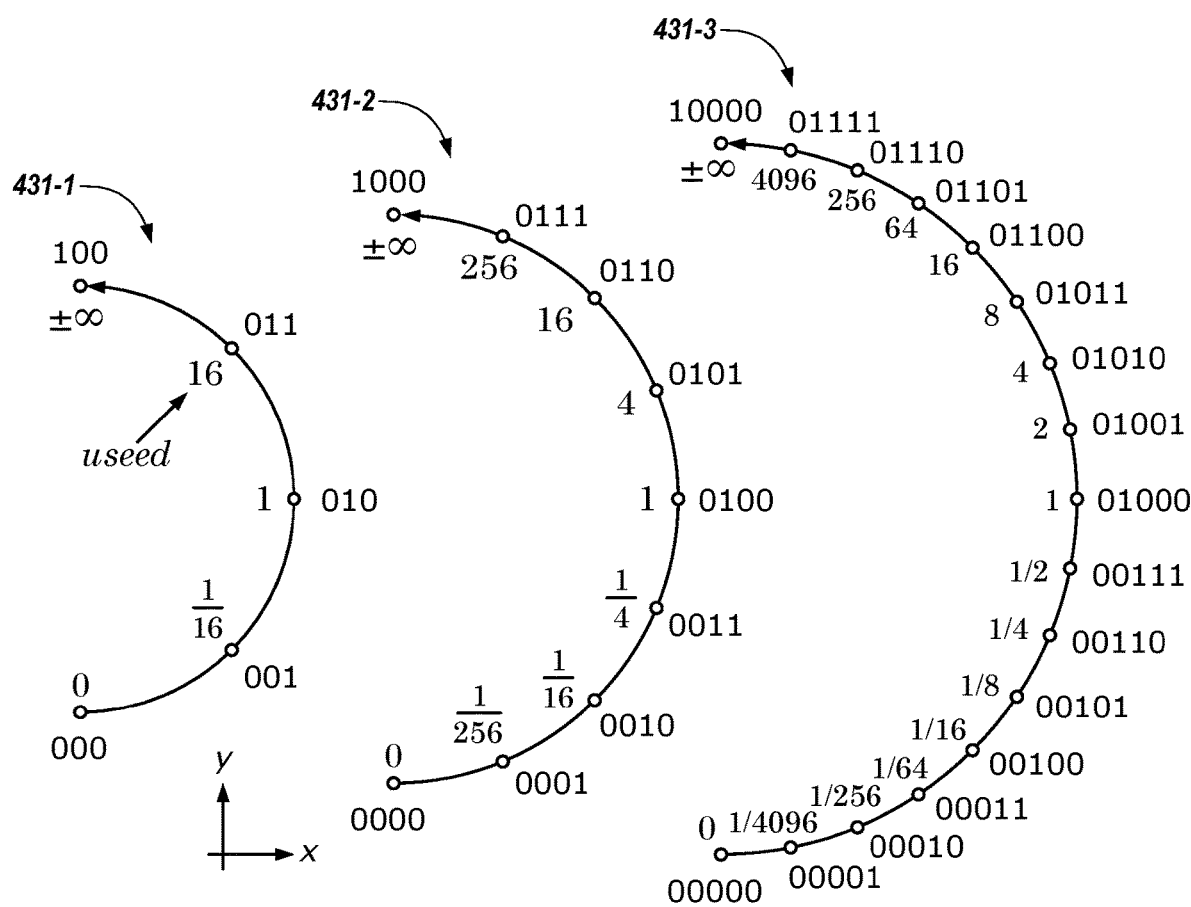
FIG. 4B is an example of posit construction using two exponent bits.

If maxpos is the largest positive value of a bit string of the posits 431-1, 431-2, 431-3 shown in FIG. 4B, and minpos is the smallest value of a bit string of the posits 431-1, 431-2, 431-3, maxpos may be equivalent to useed and minpos may be equivalent to $$\frac{1}{useed}.$$

Between maxpos and ±∞, a new bit value may be maxpos*useed, and between zero and minpos, a new bit value may be $$\frac{minpos}{useed}.$$

These new bit values can correspond to a new regime bit 335. Between existing values x=$2^m$ and y=$2^n$, where m and n differ by more than one, the new bit value may be given by the geometric mean:

$$\sqrt{x \times y} = 2^{\frac{(m+n)}{2}},$$

which corresponds to a new exponent bit 337. If the new bit value is midway between the existing x and y values next to it, the new bit value can represent the arithmetic mean $$\frac{x+y}{2},$$

which corresponds to a new mantissa bit 339.

FIG. 4B is an example of posit construction using two exponent bits. In FIG. 4B, only the right half of projective real numbers, however, it will be appreciated that negative projective real numbers that correspond to their positive counterparts shown in FIG. 4B can exist on a curve representing a transformation about the y-axis of the curves shown in FIG. 4B. The posits 431-1, 431-2, 431-3 shown in FIG. 4B each include only two exception values: Zero (0) when all the bits of the bit string are zero and ±∞ when the bit string is a one (1) followed by all zeros. It is noted that the numerical values of the posits 431-1, 431-2, 431-3 shown in FIG. 4 are exactly useed$^k$. That is, the numerical values of the posits 431-1, 431-2, 431-3 shown in FIG. 4 are exactly useed to the power of the k value represented by the regime (e.g., the regime bits 335 described above in connection with FIG. 3). In FIG. 4B, the posit 431-1 has es=2, so useed=$2^{2^{es}}$=16, the posit 431-2 has es=3, so useed=$2^{2^{es}}$=256, and the posit 431-3 has es=4, so useed=$2^{2^{es}}$=4096.

As an illustrative example of adding bits to the 3-bit posit 431-1 to create the 4-bit posit 431-2 of FIG. 4B, the useed=256, so the bit string corresponding to the useed of 256 has an additional regime bit appended thereto and the former useed, 16, has a terminating regime bit ($\bar{r}$) appended thereto. As described above, between existing values, the corresponding bit strings have an additional exponent bit appended thereto. For example, the numerical values 1/16, 1/4, 1, and 4 will have an exponent bit appended thereto. That is, the final one corresponding to the numerical value 4 is an exponent bit, the final zero corresponding to the numerical value 1 is an exponent bit, etc. This pattern can be further seen in the posit 431-3, which is a 5-bit posit generated according to the rules above from the 4-bit posit 431-2. If another bit was added to the posit 431-3 in FIG. 4B to generate a 6-bit posit, mantissa bits 339 would be appended to the numerical values between 1/16 and 16.

A non-limiting example of decoding a posit (e.g., a posit 431) to obtain its numerical equivalent follows. In some embodiments, the bit string corresponding to a posit p is an unsigned integer ranging from $-2^{n-1}$ to $2^{n-1}$, k is an integer corresponding to the regime bits 335 and e is an unsigned integer corresponding to the exponent bits 337. If the set of mantissa bits 339 is represented as $\{f_1 f_2 \ldots f_{fs}\}$ and f is a value represented by $1.f_1 f_2 \ldots f_{fs}$ (e.g., by a one followed by a decimal point followed by the mantissa bits 339), the p can be given by Equation 1, below.

$$x = \begin{cases} 0, & p = 0 \\ \pm\infty, & p = -2^{n-1} \\ \text{sign}(p) \times useed^k \times 2^e \times f, & \text{all other } p \end{cases} \quad \text{Equation 1}$$

A further illustrative example of decoding a posit bit string is provided below in connection with the posit bit string 0000110111011101 shown in Table 3, below follows.

TABLE 3

| SIGN | REGIME | EXPONENT | MANTISSA |
|------|--------|----------|----------|
| 0 | 0001 | 101 | 11011101 |

In Table 3, the posit bit string 0000110111011101 is broken up into its constituent sets of bits (e.g., the sign bit 333, the regime bits 335, the exponent bits 337, and the mantissa bits 339). Since es=3 in the posit bit string shown in Table 3 (e.g., because there are three exponent bits), useed=256. Because the sign bit 333 is zero, the value of the numerical expression corresponding to the posit bit string shown in Table 3 is positive. The regime bits 335 have a run of three consecutive zeros corresponding to a value of −3 (as described above in connection with Table 1). As a result, the scale factor contributed by the regime bits 335 is $256^{-3}$ (e.g., useed$^k$). The exponent bits 337 represent five (5) as an unsigned integer and therefore contribute an additional scale factor of $2^e=2^5=32$. Lastly, the mantissa bits 339, which are given in Table 3 as 11011101, represent two-hundred and twenty-one (221) as an unsigned integer, so the mantissa bits 339, given above as f are $$f + \frac{221}{256}.$$

Using these values and Equation 1, the numerical value corresponding to the posit bit string given in Table 3 is $$+256^{-3} \times 2^5 \times \left(1 + \frac{221}{256}\right) = \frac{437}{134217728} \approx 3.55393 \times 10^{-6}.$$

Figure 5:
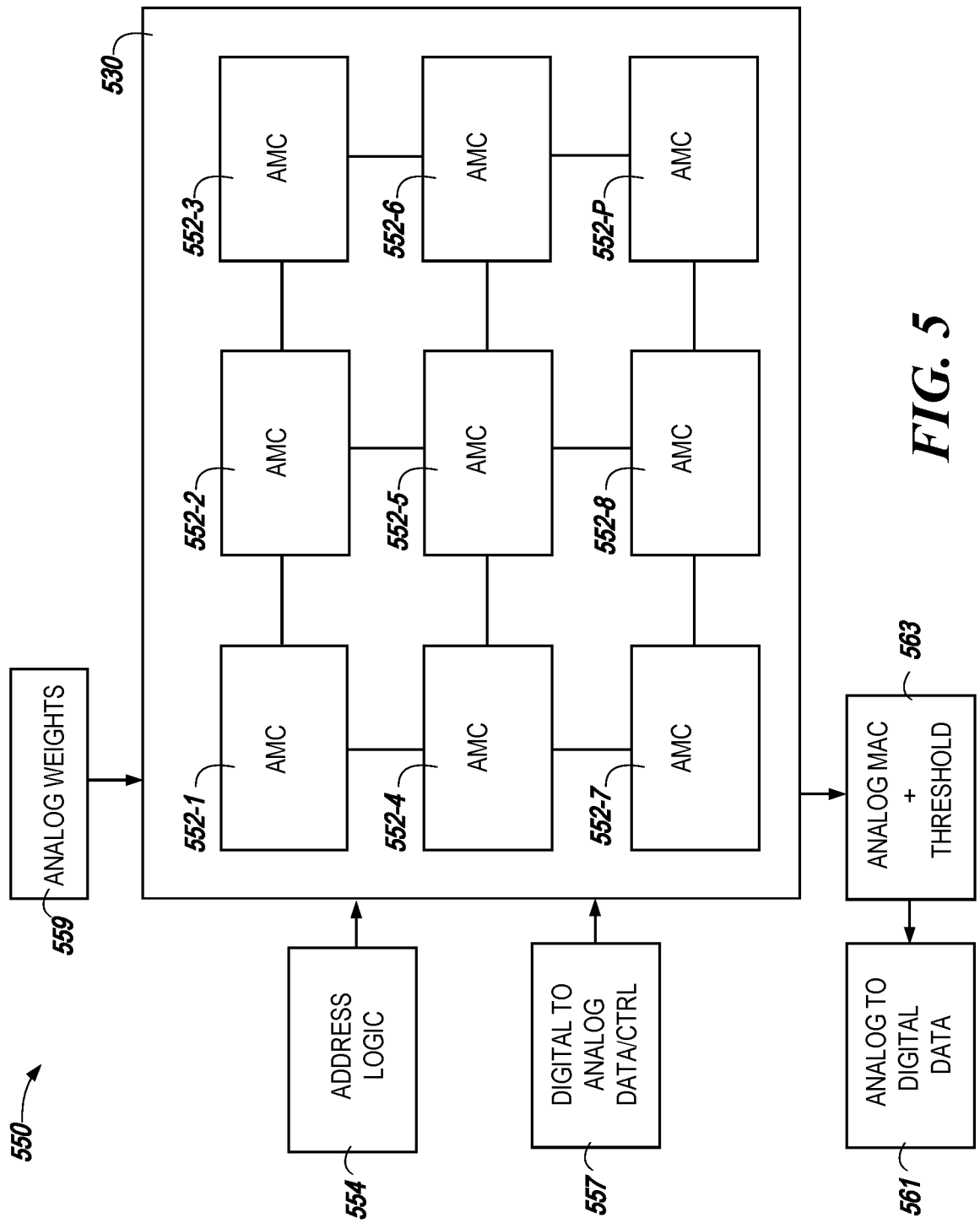
FIG. 5 is a functional block diagram in the form of a neuromorphic memory array, a digital to analog converter, and an analog to digital data converter in accordance with a number of embodiments of the present disclosure.

FIG. 5 is a functional block diagram 550 in the form of a neuromorphic memory array 530, a digital to analog converter 557, and an analog to digital data converter 561 in accordance with a number of embodiments of the present disclosure. The neuromorphic memory array 530 can received data from a host (e.g., host 102, 202 in FIGS. 1, 2A, 2B) or other external device. The data can include bit strings in a first format (e.g., an unum number or posit format). The data in the posit format can be converted, by a digital to analog converter 557 (e.g., where data is received and controlled ("data/ctrl"), upon receipt of the data. The data can be stored, once it is converted to analog, in a plurality of analog memory cells ("AMC") 552-1 to 552-P (hereinafter referred to as AMCs 552). Address logic 554 can be used to identify a location of a particular cell, such as a first AMC 552-1, in order to store data at its correct location in the neuromorphic memory array 530.

In one embodiment, neuromorphic operations can be performed using the AMCs 552 as a neural network. Some neuromorphic systems may use resistive RAM (RRAM) such as PCM devices or self-selecting memory devices to perform neuromorphic operations by storing a value (or weight) of a synapse (e.g., synaptic weight). Such variable resistance memory may include memory cells configured to store multiple levels and/or that may have wide sense windows. Such types of memory may be configured to perform at least a portion of a neuromorphic operation by performing training operations by pulse (e.g., spike) control. Such training operations may include spike-timing-dependent plasticity (STDP). STDP may be a form of Hebbian learning that is induced by correlation between spikes transmitted between nodes (e.g., neurons). STDP may be an example of a process that adjusts the strength of connections between nodes (e.g., neurons).

In neural networks, a synaptic weight refers to the strength or amplitude of a connection between two nodes (e.g., neurons). The nature and content of information transmitted through a neural network may be based in part on the properties of connections, which represent synapses, formed between the nodes. For example, the property of the connections can be synaptic weights. Neuromorphic systems and devices, among others, may be designed to achieve results that may not be possible with traditional computer architectures. For example, neuromorphic systems may be used to achieve results more commonly associated with biological systems such as learning, vision or visual processing, auditory processing, advanced computing, or other processes, or a combination thereof. As an example, performance of neuromorphic operations can include using the synaptic weight and/or connections between at least two memory cells to represent a synapse, or a strength or degree of connectivity of the synapse and be associated with a respective short-term connection or a long-term connection, which corresponds to the biological occurrence of short-term and long-term memory. A series of neural network or neuromorphic operations can be performed in order to increase the synaptic weight between the at least two memory cells in a short-term or a long-term fashion, depending on which type of memory cell is used, as will be described below.

A learning event of a neural network or neuromorphic operation can represent causal propagation of spikes among neurons, enabling a weight increase for the connecting synapses. A weight increase of a synapse can be represented by an increase in conductivity of a memory cell. A variable resistance memory array (for example a 3D cross-point or self-selecting memory (SSM) array) can mimic an array of synapses, each characterized by a weight, or a memory cell conductance. The greater the conductance, the greater the synaptic weight and the higher the degree of memory learning. Short-term memory learning can be a fast and/or reversible memory learning where the analog weight of a synapse is enhanced, namely, its electrical conduction is increased by a reversible mechanism. Long-term memory learning can be a slow and/or irreversible memory learning where the cell conductance is irreversibly increased for a particular state (e.g., SET or RESET), leading to unforgettable memory coming from a longer, experience-dependent learning.

Neuromorphic operations can be used to mimic neurobiological architectures that may be present in a nervous system and/or to store synaptic weights associated with long-term and short-term learning or relationships are described herein. A memory apparatus may include a memory array including a first portion and a second portion. The first portion of the memory array can include a first plurality of variable resistance memory cells and the second portion can include a second plurality of variable resistance memory cells. The second portion can be degraded through forced write cycling. The degradation mechanism can include damage to the chalcogenide material. In some embodiments that include memory cells comprised of material other than chalcogenide material, the degradation mechanism can include the thermal relationship between memory cells, control via control gate coupling between memory cells, a charge loss corresponding to the memory cells, a temperature induced loss of signal or threshold, etc.

These neuromorphic operations can be performed on data received by the neuromorphic memory array 530. In anticipation of the neural network being used to detect a particular event represented by the data or a pattern in the data, the neural network can receive a large amount of data (what may be referred to as analog weights 559) used to train the neural network (e.g., the data stored in the AMCs 552). In one embodiment, as the data including bit strings is received, analog weights 559 can be added to the data values in order to train the data values for subsequent neuromorphic processing. The training can include a large volume of data that allows the neural network of the neuromorphic memory array 530 to correctly interpret the data and provide a desired or helpful result. Using the neural network processing described above, the large amount of data can train the neural network of the neuromorphic memory array 530 to detect the event or pattern and become more effective and efficient at doing so.

Upon completion of a neuromorphic operation using analog weights 559 on the data in an analog format stored in the AMCs 552, the resultant analog data can be converted, by an analog to digital converter ("Analog to digital data") 561, to data in a non-analog format (e.g., an unum or posit format). In order to do so, an operation ("Analog MAC+ threshold") 563 can be performed on the data in order to properly sort the analog values for conversion to the non-analog format. In a 6-bit value, for example, represented by the analog value, a number of thresholds can represent which values of the 6 bits are represented by which thresholds. The threshold data of the operation 563 can be used to determine how to interpret the analog data and where to locate the analog values along the corresponding scale of the non-analog format in relation to the more discrete format.

The resultant value of the neuromorphic operation can be sent outside the neuromorphic memory array 530 for further processing in the non-analog format by control circuitry (such as control circuitry 120/220 in FIGS. 1 and 2A) and other storage locations. In this way, multiple levels of processing can occur on the same portion of data. For example, a command can be sent from a host to perform both arithmetic/logical operations and neuromorphic operations on a set of data.

Depending on the order of processing, the arithmetic operations can be performed while the data is in the non-analog format and outside the neuromorphic memory array 530. The result of the arithmetic operation can be sent to the neuromorphic memory array 530 and converted to an analog format. Subsequent to the neuromorphic operations being performed, the data can be converted back to the non-analog format and sent back to the host with both operations being performed. Likewise, the data my be received in the non-analog format and converted to an analog format first in order for the neuromorphic operations to be performed first. The result of the neuromorphic operation can be converted to the non-analog format and subsequent arithmetic operations can be performed. The result of the arithmetic operations can be sent back to the host.

Figure 6:
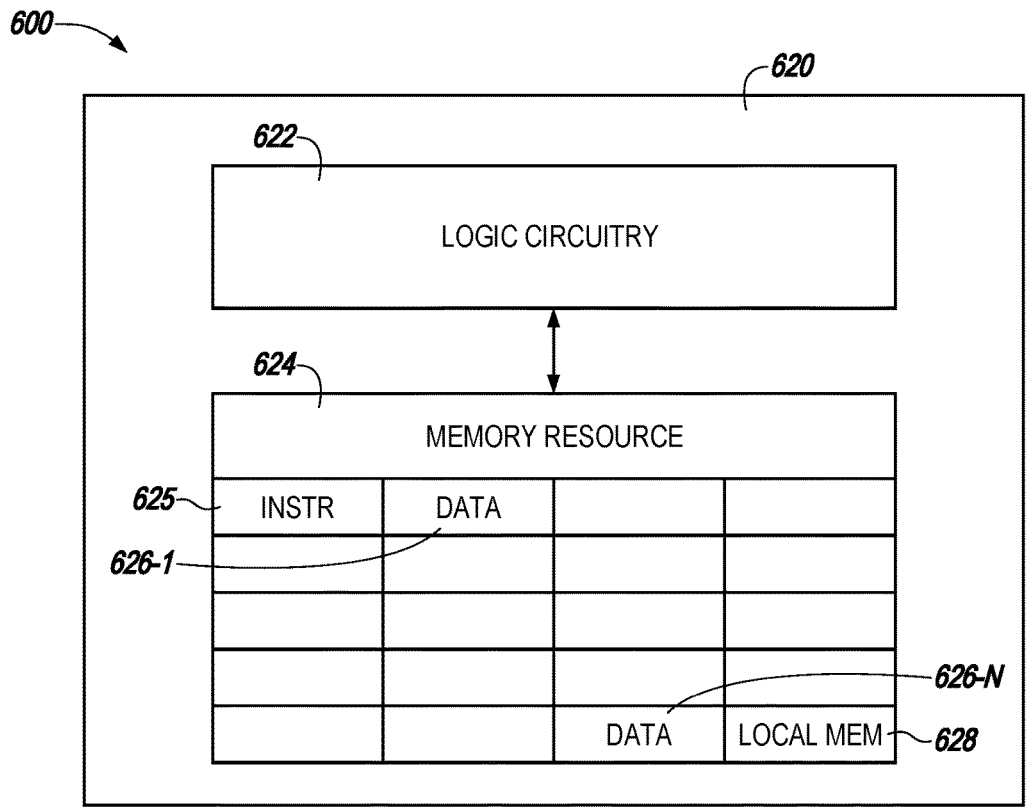
FIG. 6 is a functional block diagram in the form of control circuitry in accordance with a number of embodiments of the present disclosure.

FIG. 6 is a functional block diagram in the form of an apparatus 600 including control circuitry 620 in accordance with a number of embodiments of the present disclosure. The control circuitry 620 can include logic circuitry 622 and a memory resource 624, which can be analogous to the processing resource 122 and the memory resource 124 illustrated in FIG. 1, herein. The logic circuitry 622 and/or the memory resource 624 can separately be considered an "apparatus."

The control circuitry 620 can be configured to receive a bit string in the posit format from a host (e.g., the host 102/202 illustrated in FIGS. 1, 2A, and 2B, herein). In some embodiments, the posit bit string can be stored in the memory resource 624. Once the bit string has been received by the control circuitry 620, arithmetic and/or logical operations can be performed on the posit bit string in the absence of intervening commands from the host and/or the controller. For example, the control circuitry 620 can include sufficient processing resources and/or instructions to perform arithmetic and/or logical operations on the bit strings stored in the memory resource 624 without receiving additional commands from circuitry external to the control circuitry 620.

The logic circuitry 622 can be an arithmetic logic unit (ALU), a state machine, sequencer, controller, an instruction set architecture (ISA), or other type of control circuitry. As described above, an ALU can include circuitry to perform operations (e.g., arithmetic operations, logical operations, bitwise operations, etc.) such as the operations described above, on integer binary numbers, such as bit strings in the posit format. An instruction set architecture (ISA) can include a reduced instruction set computing (RISC) device. In embodiments in which the logic circuitry 622 includes a RISC device, the RISC device can include a processing resource that can employ an instruction set architecture (ISA) such as a RISC-V ISA, however, embodiments are not limited to RISC-V ISAs and other processing devices and/or ISAs can be used.

In some embodiments, the logic circuitry 622 can be configured to execute instructions (e.g., instructions stored in the INSTR 625 portion of the memory resource 624) to perform the operations above. For example, the logic circuitry 624 is provisioned with sufficient processing resources to cause performance of arithmetic and/or logical operations on the data (e.g., on bit strings) received by the control circuitry 620.

Once the arithmetic and/or logical operation(s) are performed by the logic circuitry 622, the resultant bit strings can be stored in the memory resource 624 and/or a memory array (e.g., the neuromorphic memory array 230 illustrated in FIG. 2A, herein). The stored resultant bit strings can be addressed such that they are accessible for performance of the operations. For example, the bit strings can be stored in the memory resource 624 and/or the memory array at particular physical addresses (which may have corresponding logical addresses corresponding thereto) such that the bit strings can be accessed in performing the operations.

The memory resource 624 can, in some embodiments, be a memory resource such as random-access memory (e.g., RAM, SRAM, etc.). Embodiments are not so limited, however, and the memory resource 624 can include various registers, caches, buffers, and/or memory arrays (e.g., 1T1C, 2T2C, 3T, etc. DRAM arrays). The memory resource 624 can be configured to receive a bit string (e.g., a bit string in the posit format) from, for example, a host such as the host 102/202 illustrated in FIGS. 1, 2A, and/or a memory array such as the neuromorphic memory array 230 illustrated in FIG. 2A, herein. In some embodiments, the memory resource 638 can have a size of approximately 256 kilobytes (KB), however, embodiments are not limited to this particular size, and the memory resource 624 can have a size greater than, or less than, 256 KB.

The memory resource 624 can be partitioned into one or more addressable memory regions. As shown in FIG. 6, the memory resource 624 can be partitioned into addressable memory regions so that various types of data can be stored therein. For example, one or more memory regions can store instructions ("INSTR") 625 used by the memory resource 624, one or more memory regions can store data 626-1, . . . , 626-N (e.g., data such as a bit string retrieved from the host and/or the memory array), and/or one or more memory regions can serve as a local memory ("LOCAL MEM.") 628 portion of the memory resource 638. Although 20 distinct memory regions are shown in FIG. 6, it will be appreciated that the memory resource 624 can be partitioned into any number of distinct memory regions.

As discussed above, the bit string(s) can be retrieved from the host and/or memory array in response to messages and/or commands generated by the host, a controller (e.g., the controller 210 illustrated in FIG. 2A, herein), or the logic circuitry 622. In some embodiments, the commands and/or messages can be processed by the logic circuitry 622. Once the bit string(s) are received by the control circuitry 620 and stored in the memory resource 624, they can be processed by the logic circuitry 622. Processing the bit string(s) by the logic circuitry 622 can include performing arithmetic operations and/or logical operations on the received bit string(s).

In a non-limiting neural network training application, the control circuitry 620 can receive an analog bit string that has been converted from an 8-bit posit with es=0. In contrast to some approaches that utilize an 8-bit posit bit string with es=0, an analog bit string can provide neural network training results faster than the 8-bit posit bit string.

Figure 7:
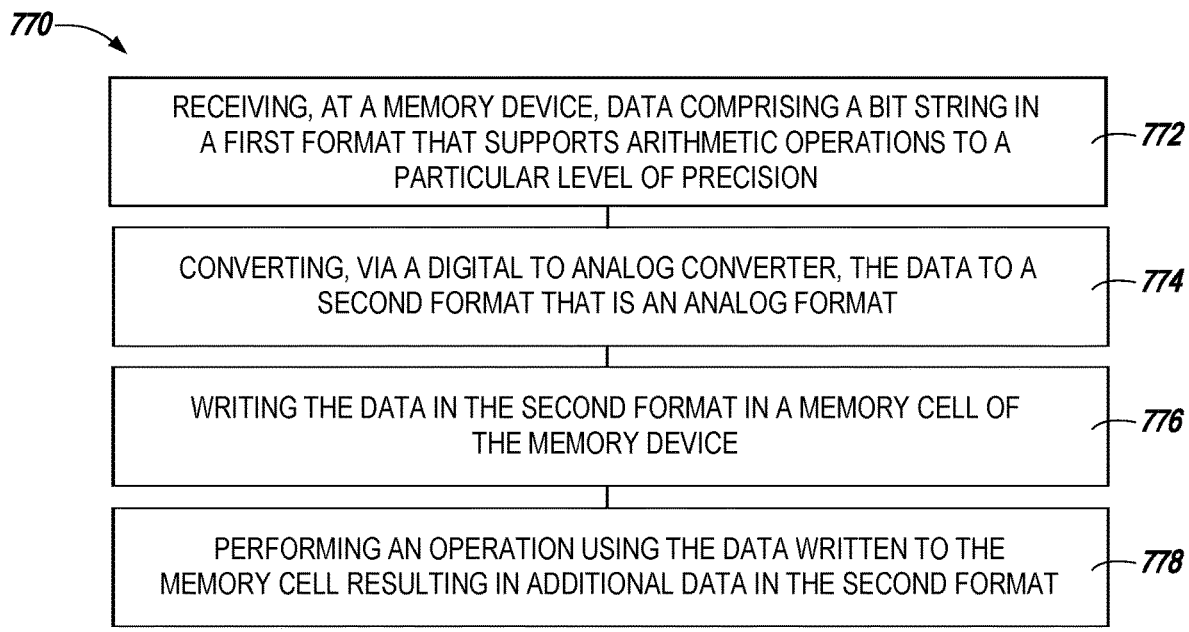
FIG. 7 is a flow diagram representing an example method for neuromorphic operations using posits in accordance with a number of embodiments of the present disclosure.

FIG. 7 is a flow diagram representing an example method 770 for neuromorphic operations on posits in accordance with a number of embodiments of the present disclosure. At block 772, the method 770 can include receiving, at a memory device, data comprising a bit string in a first format that supports arithmetic operations to a particular level of precision. The memory device can be analogous to the memory device 104 illustrated in FIGS. 1 and 204 illustrated in FIG. 2A. The first format can be the posit format At block 774, the method 770 can include converting, via a digital to analog converter, the data to a second format that is an analog format. The digital to analog converter can be analogous to the digital to analog converter 557 in FIG. 5 herein. In some embodiments, the first format can be an analog format and the second format can be a posit format. Further, the second format can include a mantissa, a regime, a sign, and an exponent.

At block 776, the method 770, can include writing the data in the second format in a memory cell of the memory device. The memory cell can be a memory cell 552 as illustrated in FIG. 5 herein. The method 770 can further include adding an analog weight to the data in the second format resulting in adjusted data and writing the adjusted data to the memory cell.

At block 778, the method 770 can include performing an operation using the data written to the memory cell resulting in additional data in the second format. The method 770 can further include converting the additional data in the second format to additional data in the first format. The method 770 can further include sending the additional data in the first format to a device external to the memory device. The device external to the memory device can be a host. In some embodiments, performance of the operation can include performing a neuromorphic operation on the data written to the memory cell. In some example, performance of the operation on the data in the second format occurs in a shorter amount of time or in a fewer number of sub-operations than if the operation is performed on the same data represented in the first format.

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and processes are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
a memory device comprising a plurality of memory cells, wherein the plurality of memory cells are each configured to store data comprising a bit string in an analog format; and
an analog to digital converter coupled to the memory device, wherein the analog to digital converter is configured to convert the bit string in the analog format stored in at least one of the plurality of memory cells to a posit format that supports arithmetic operations to a particular level of precision.

2. The apparatus of claim 1, wherein the posit format that supports arithmetic operations is a universal number format.

3. The apparatus of claim 1, wherein the posit format that supports arithmetic operations includes a regime and is a Type III universal number format.

4. The apparatus of claim 1, wherein the posit format that supports arithmetic operations includes a mantissa, a sign, a regime, and an exponent portion.

5. The apparatus of claim 1, further comprising a processing device coupled to the memory device, the processing device configured to cause the data having the bit string with the posit format that supports arithmetic operations to be transferred to circuitry external to the host computing device.

6. The apparatus of claim 1, further comprising a controller, wherein the controller is configured to send the data comprising the bit string converted to the posit format that supports arithmetic operations to an external circuitry.

7. The apparatus of claim 1, further comprising a digital to analog converter, wherein the digital to analog converter is configured to convert a received value in the posit format that supports arithmetic operations to the analog format.

8. The apparatus of claim 7, further comprising a controller, wherein the controller is configured to store the data comprising the bit string converted to the analog format in a memory cell of the memory device.

9. A method, comprising:
receiving, at a memory device, data comprising a bit string in a posit format that supports arithmetic operations to a particular level of precision;
converting, via a digital to analog converter, the data to an analog format;
writing the data in the analog format in a memory cell of the memory device; and
performing an operation using the data written to the memory cell resulting in additional data in the analog format.

10. The method of claim 9, further comprising converting the additional data in the analog format to additional data in the posit format.

11. The method of claim 10, further comprising sending the additional data in the posit format to a device external to the memory device.

12. The method of claim 11, wherein the device external to the memory device is a host.

13. The method of claim 9, wherein performance of the operation comprises performing a neuromorphic operation on the data written to the memory cell.

14. The method of claim 9, further comprising adding an analog weight to the data in the analog format resulting in adjusted data and writing the adjusted data to the memory cell.

15. The method of claim 9, wherein performance of the operation on the data in the analog format occurs in a shorter amount of time or in a fewer number of sub-operations than when the operation is performed on the same data represented in the posit format.

16. A system, comprising:
   a memory device, comprising:
      control circuitry; and
      a memory array coupled to the control circuitry and comprising a plurality of memory cells, wherein the plurality of memory cells are configured to store data comprising a bit string in an analog format; and
   a digital to analog converter coupled to the memory device, wherein the digital to analog converter is configured to convert data comprising a bit string received in a posit format that supports arithmetic operations to a particular level of precision to the analog format;
   wherein the control circuitry is configured to:
      receive data in the analog format; and
      store the data in the analog format in at least one of the plurality of memory cells; and
      perform a neuromorphic operation on the data stored in the analog format.

17. The system of claim 16, further comprising an analog to digital converter coupled to the memory device and configured to convert data in the analog format to data in the posit format.

18. The system of claim 17, wherein:
   the analog to digital converter is configured to convert the data on which the neuromorphic operation is performed from the analog format to the posit format; and
   the control circuitry is further configured to send the data converted to the posit format to a device external to the system.

19. The system of claim 16, wherein the control circuitry is configured to receive a command to perform a neuromorphic operation on data received in the first format.

20. The system of claim 16, wherein the bit string in the posit format comprises a Type II universal number format.

* * * * *